United States Patent [19]

Fields et al.

[11] Patent Number: 4,821,007
[45] Date of Patent: Apr. 11, 1989

[54] STRIP LINE CIRCUIT COMPONENT AND METHOD OF MANUFACTURE

[75] Inventors: Walter D. Fields; Gary K. Larkins, both of Beaverton, Oreg.

[73] Assignee: Tektronix, Inc., Beaverton, Oreg.

[21] Appl. No.: 11,972

[22] Filed: Feb. 6, 1987

[51] Int. Cl.⁴ .............................................. H01P 3/08
[52] U.S. Cl. ................................. 333/238; 174/68.5; 29/830; 29/846; 29/852; 333/116
[58] Field of Search ............... 333/116, 115, 238, 246; 29/830, 846, 852; 174/68.5

[56] References Cited

U.S. PATENT DOCUMENTS

| | | | |
|---|---|---|---|
| 3,351,816 | 11/1967 | Sear et al. | 333/238 x |
| 3,398,232 | 8/1968 | Hoffman | 333/238 X |
| 3,460,069 | 8/1969 | Uberbacher et al. | 333/116 |
| 3,568,098 | 3/1971 | Gerst | 333/116 |
| 3,780,431 | 12/1973 | Feeney | 174/68.5 X |
| 3,876,822 | 4/1975 | Davy et al. | 174/68.5 X |
| 4,127,832 | 11/1978 | Riblet | 333/116 |
| 4,150,345 | 4/1979 | Goldman et al. | 333/116 |
| 4,366,198 | 12/1982 | Ramspacher, Jr. | 174/68.5 X |
| 4,372,046 | 2/1983 | Suzuki | 29/413 X |
| 4,375,053 | 2/1983 | Viola et al. | 333/116 |
| 4,375,054 | 2/1983 | Pavio | 333/116 |
| 4,538,346 | 9/1985 | Street | 29/846 X |
| 4,609,892 | 9/1986 | Higgins, Jr. | 333/238 X |
| 4,647,878 | 3/1987 | Landis et al. | 333/116 X |
| 4,673,904 | 6/1987 | Landis | 333/238 |
| 4,681,656 | 7/1987 | Byrum | 174/68.5 X |

FOREIGN PATENT DOCUMENTS 1949433  4/1971  Fed. Rep. of Germany ...... 333/116

OTHER PUBLICATIONS

Gyurk, W. J.; "Break Apart Laminated Substrates"; Western Electric Technical Digest; Oct. 1966; p. 15.

Primary Examiner—Eugene R. LaRoche
Assistant Examiner—Benny T. Lee
Attorney, Agent, or Firm—William Y. Conwell; William K. Bucher

[57] ABSTRACT

An improved strip line component and method of manufacture are disclosed that permit strip line circuits to be packaged in component form and to be soldered directly to conventional circuit boards. Electrical contact pads are formed on the side of the strip line component during fabrication by drilling holes through the multilayer laminar assembly and plating the holes with a conductive material. The laminar assembly is then cut along lines that intersect the holes, thereby exposing plated indentations along the sides of the cut component. The component so cut can then be soldered to a circuit board using the plated indentations. The method is well adapted to the economical manufacture of large numbers of identical components.

9 Claims, 2 Drawing Sheets

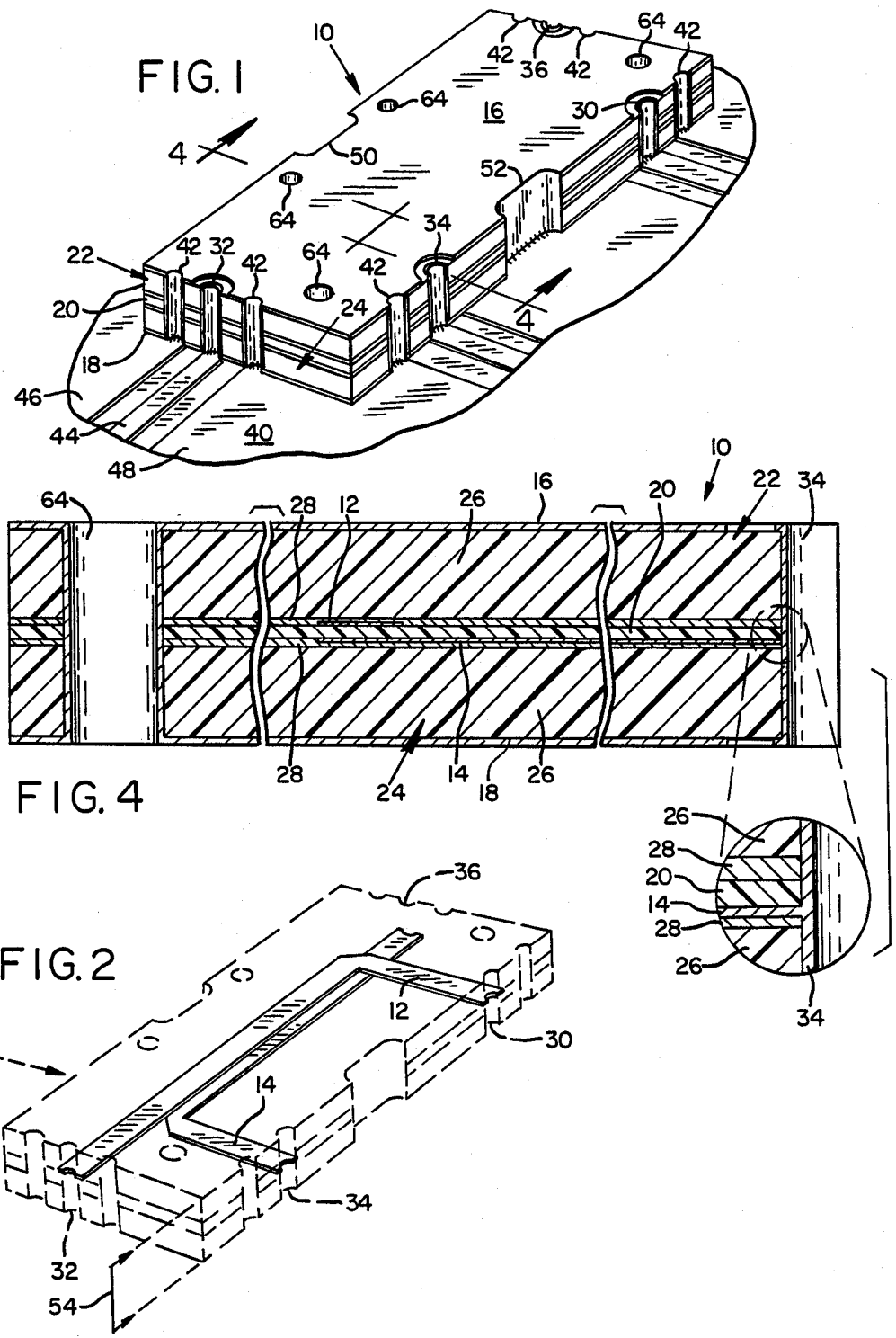

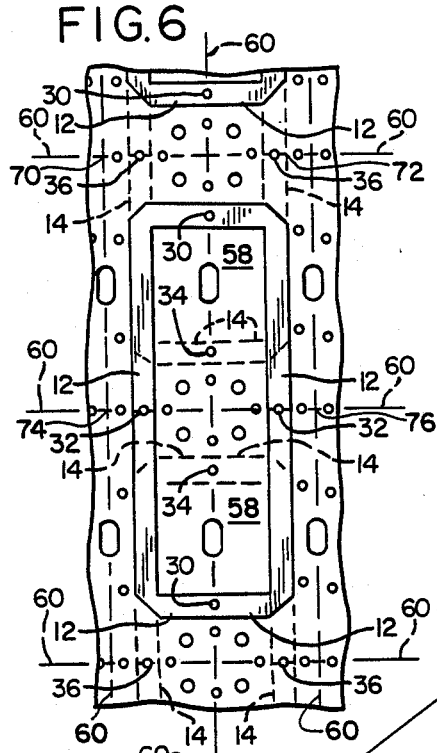
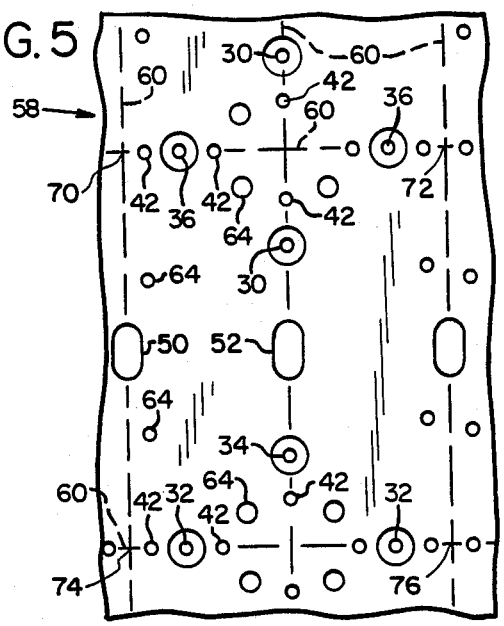
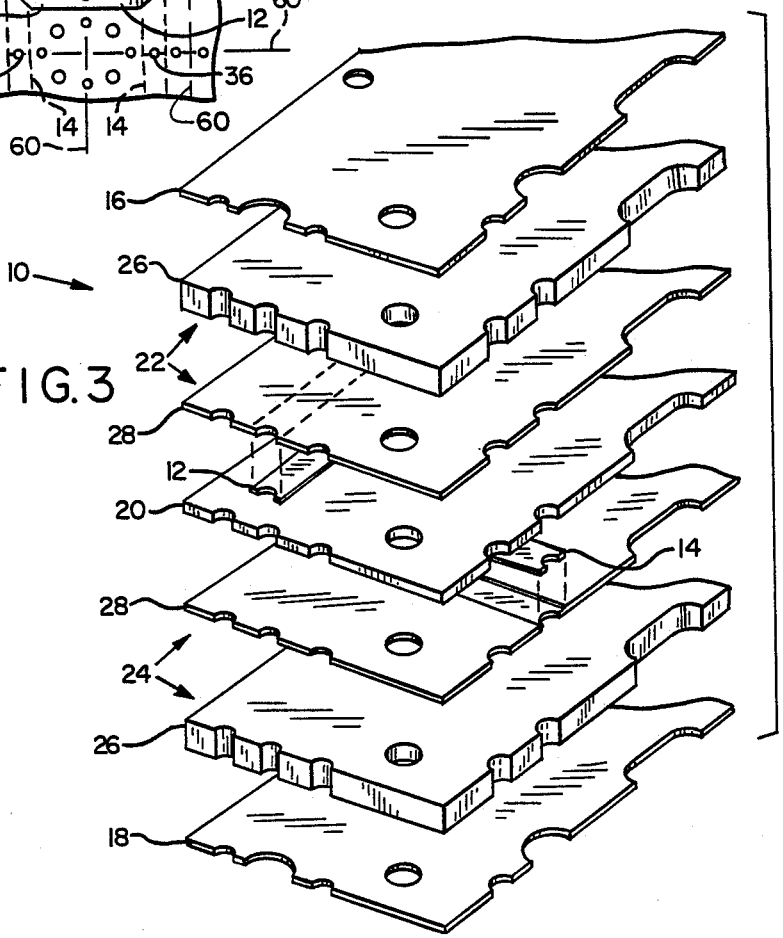

STRIP LINE CIRCUIT COMPONENT AND METHOD OF MANUFACTURE

TECHNICAL FIELD

The present invention relates to strip line circuitry, and more particularly to strip line circuit components which include integral electrical contact pads around their periphery to facilitate external connections to the transmission lines disposed within such components.

BACKGROUND AND SUMMARY OF THE INVENTION

Strip line and microstrip techniques are increasingly being used in microwave circuits to provide well characterized transmission line conductors that can be used to interconnect discrete circuit elements and to perform various impedance transformation functions. Both techniques, however, suffer from a variety of drawbacks.

Microstrip is generally characterized by a planar transmission line conductor spaced above a conducting ground plane. The impedance and velocity factor of the transmission line so formed is determined by factors such as the dielectric characteristics of the surrounding materials, the width of the planar conductor and its spacing from the ground plane.

In free space, microstrip works well. In actual application, however, its operation is sometimes impaired by stray coupling between the transmission line conductor and nearby objects. Fringing of the usual electromagnetic fields that extend above the conductor to foreign objects introduces irregularities into the impedance and velocity factor of the line, with a consequent undesirable effect on circuit performance.

In contrast to microstrip, strip line is generally characterized by a planar transmission line conductor disposed between two ground planes. Such construction offers a significant advantage over microstrip in that the problem of stray coupling to nearby objects is avoided. The second ground plane, which is omitted in microstrip construction, shields the transmission line conductor from the effects of nearby bodies and serves to confine the electromagnetic fields to the region between the two ground planes.

Although strip line is preferred because of its superior performance, microstrip is more often used because of practical considerations. First, microstrip circuitry is easier to fabricate. A conventional double sided printed circuit board can be formed into a microstrip circuit board by etching one side to form the transmission line conductors and leaving the other side unetched to serve as the ground plane. Furthermore, components such as transistors, resistors and capacitors can readily be soldered to the exposed microstrip transmission line conductors in order to form the desired electrical circuit. Strip line is cumbersome in comparison.

To construct an electronic circuit with strip line techniques, the desired transmission line conductors must first be sandwiched between two ground planes. This is normally done by fabricating a custom laminated assembly. The components must then be connected to the various transmission line conductors. This step is complicated by the fact that the transmission line conductors are, by necessity, isolated between the two ground planes. While insulated conductors extending up or down through a ground plane can be employed to connect external components to the embedded transmission lines, the attendant circuit complexity is substantial. The manufacture of a strip line circuit is thus significantly more difficult than that of a corresponding microstrip circuit.

In view of the practical difficulties associated with strip line, microstrip is used for the majority of microwave circuit applications. In some applications, however, even a small amount of stray coupling between a transmission line conductor and a foreign body, as might be expected to occur in any microstrip contruction, is unacceptable. One such application is in quadrature directional couplers.

In a directional coupler, power is coupled from a primary transmission line to a secondary transmission line by bringing the center conductors of these two lines sufficiently close to cause interaction of the transmission lines' electromagnetic fields. The end of the secondary transmission line adjacent the primary transmission line input is termed the coupled output. The opposite end of the secondary line is terminated in a matched load and is termed the isolated port. In operation, a known fraction, usually half, of the energy flowing in the forward direction of the primary transmission line appears at the coupled output. The other half of the energy appears at the far end of the primary transmission line, termed the direct output. In a quadrature directional coupler, the signals at the coupled and direct outputs are 90 degrees out of phase.

A system that employs a quadrature directional coupler is usually dependent, for proper operation, on precise matching of the magnitudes of the two outputs and a precise 90 degree phase shift. Such performance is usually not obtainable in a microstrip coupler because stray coupling to the transmission line conductors often causes an imbalance between the magnitudes of the output signals or a deviation from the desired quadrature phase relationship. In order to obtain satisfactory performance, microstrip couplers are generally not formed as an integral part of a system's main circuit board but are instead placed in a shielded enclosure and are connected to the circuit board by coaxial cables.

Even when a microstrip coupler is shielded to protect it from the effects of stray coupling, several operational defects persist. One is the problem of controlling the electromagnetic coupling between the two transmission line conductors to within a tight tolerance. When the coupling coefficient required between the transmission lines is high, the transmission line conductors must be spaced very closely. Because of this close spacing, any slight deviation presents a very great variation in coupling and a consequent imbalance between the magnitudes of the two outputs. Although photolithographic circuit board etching techniques are constantly improving, it is still difficult to obtain the requisite degree of accuracy in spacing required by microwave devices.

As still a further defect, microstrip couplers suffer from dispersion of the electromagnetic waves propagating along the coupled transmission lines. The signal traveling down the planar microstrip conductor is accompanied by a surrounding electromagnetic field. On one side of the conductor, this field travels in the dielectric region between the conductor and the ground plane. On the other side, however, this field travels in air. The velocities of these two waves are different, resulting in a dispersion of the incident signal into two phase-shifted signals by the time the wave has traveled to the end of the conductor.

As a final drawback, mounting a microstrip coupler in a shielded enclosure requires that coaxial cables be employed to connect the coupler to the main system circuit board. This increases the cost and complexity of a system and reduces its reliability.

The above-noted drawbacks apply to a variety of microstrip transmission line circuits other than quadrature directional couplers. For example, any type of transmission line coupler or transmission line phase shifter would be so affected.

U.S. Pat. No. 4,375,054 to Pavio is illustrative of microstrip couplers. A pair of transmission line coupling elements are formed on one side of a circuit board and a ground plane is provided on the other. The circuit assembly is mounted in a shielded enclosure to minimize stray coupling. External connections are made to the coupler through coaxial bulkhead connectors on the enclosure.

In discussing alternative coupler constructions, Pavio briefly reviewed strip line couplers which have two transmission lines embedded in an insulating material, sandwiched between two outer ground planes. Pavio concluded, "The structure is bulky, costly and difficult to incorporate with other microwave circuitry."

U.S. Pat. No. 4,150,345 to Goldman et al. shows another microstrip coupler. In discussing alternative constructions, Goldman, too, dismissed strip line, noting that the transition from microstrip to strip line "is relatively costly and mechanically unreliable."

Strip line couplers, such as were maligned by Pavio and Goldman, fall into two broad classes: edge-coupled and broadside-coupled. In the edge-coupled variety, the two transmission lines are formed adjacent one another in the same plane. (Virtually all microstrip couplers are of this type). In the broadside-coupled variety, the two transmission lines are formed one above the other, separated by an insulating layer. In both varieties, the coupled transmission lines are disposed between and insulated from the upper and lower ground planes.

Examples of strip line couplers are shown in U.S. Pat. Nos. 3,568,098 to Gerst and 4,375,053 to Viola et al. Gerst shows an edge-coupled coupler. Viola shows a variation on a broadside-coupled coupler. Connections to the Gerst device are made by bulkhead coaxial connectors. Connections to the Viola device are not discussed.

Yet another strip line coupler, this one a ring coupler, is shown in U.S. Pat. No. 4,127,832 to Riblet. Connections to the device are again made by bulkhead coaxial connectors.

From the foregoing, it will be recognized that high performance couplers are generally constructed as discrete circuit subsystems and are connected to the larger systems in which they are employed by coaxial cables. This is the case both with microstrip devices that are mounted in shielded enclosures and with existing strip line devices. This design philosophy increases substantially the cost and complexity of microwave systems and degrades their performance.

The present invention is directed to an improved form of strip line construction that allows strip line circuitry to be packaged in component form so that it can be soldered directly to a circuit board, just like any other component.

Thus, it is one object of the present invention to provide a coupler that can be soldered directly to a circuit board.

It is another object of the present invention to provide, more generally, an improved transition between microstrip circuitry and strip line circuitry.

It is still another object of the present invention to provide a strip line coupler that is inexpensive to manufacture.

It is yet another object of the present invention to provide a directional coupler that can be fabricated using conventional multilayer printed circuit board techniques.

It is still another object of the present invention to construct a strip line circuit component that obviates the need for an edge plating step in fabrication.

It is yet another object of the present invention to provide a directional coupler component that is mechanically and thermally stable.

These and other objects, features and advantages of the present invention will be more readily apparent from the detailed description, which proceeds with reference to the accompanying drawings.

BRIEF DESCRIPTION OF THE DRAWINGS

FIG. 1 is an isometric view of a strip line coupler component according to the present invention soldered to a microstrip circuit board.

FIG. 2 is an isometric view showing the coupled transmission lines within the coupler component of FIG. 1.

FIG. 3 is an exploded view of the coupler of FIG. 1.

FIG. 4 is a sectional view taken along lines 4—4 of FIG. 1.

FIG. 5 is a top plan view of a plurality of couplers while still in sheet form.

FIG. 6 is a top plan view of a plurality of couplers while still in sheet form with the top ground plane and the upper insulating layers removed.

DETAILED DESCRIPTION OF THE PREFERRED EMBODIMENT

As noted, the practical problems associated with strip line construction generally prevent this technology from being employed to form entire electrical systems. However, certain elements of some systems often require a degree of performance not obtainable by microstrip technology alone. The standard practice in such cases is to construct the critical circuit element in strip line or shielded microstrip form and then connect the circuit element to the larger microstrip system by coaxial cables. As noted, this "solution" introduces a variety of other problems into the design of a system.

The present invention avoids these problems by providing strip line circuit elements in convenient component packages that can be soldered directly to the microstrip system board, just like any other resistor, capacitor or transistor component.

One important element of the invention is its use of plated through hole technology. Plated through holes have long been used to connect opposite sides of a double sided printed circuit board to one another with a low inductance path. In the present invention, however, the holes are routed not just through an insulating circuit board, but also through a strip line transmission line conductor disposed within the insulating material. When these holes are plated, the transmission line conductors that are in the board and that are intersected by the holes are electrically connected to the plating. The board can then be cut along a line that passes through each hole. The cut edge so formed includes a semicylindrical plated indentation where the cut bisected each hole. These plated surfaces on the edge of the strip line board can then be used as electrical contacts for soldering to a microstrip circuit board, just as with metal surfaces on the side of any other component. This plated indentation extends to both sides of the cut board, allowing the "component" cut from the board to have either side soldered down to the microstrip board.

A directional quadrature coupler 10 fabricated in the manner discussed above is shown in FIGS. 1-4. Coupler 10 includes two planar transmission lines 12 and 14 (FIGS. 2-4) disposed between two ground planes 16 and 18. Transmission lines 12 and 14 are formed on the upper and lower surfaces, respectively, of an inner dielectric layer 20. Disposed between transmission line conductors 12, 14 and ground planes 16, 18 are upper and lower dielectric layers 22, 24, respectively.

In the illustrated embodiment, dielectric layers 20, 22 and 24 comprise FR-4 type glass-epoxy circuit boards. Inner dielectric layer 20 is a 10 mil circuit board with two sides clad. Coupling conductors 12 and 14 are formed from the cladding material on the inner layer by conventional photolithographic techniques. Outer dielectric layers 22 and 24 are each approximately 65 mils thick. This thickness includes a 62 mil single sided circuit board 26 and approximately three mils of epoxy bonding material 28 which bonds each board 26 to inner dielectric layer 20 (FIGS. 2, 4). The epoxy bonding material 28 is selected to have a dielectric constant substantially equal to that of the FR-4 boards. The cladding on the outer circuit boards serves as outer ground planes 16 and 18.

FIG. 2 shows the layout of coupling conductors within directional coupler 10. The physical dimensions of the coupling elements can be computed using any microwave synthesis tool. The coupling requirements dictate the line widths, line spacing and ground plane spacing. In the illustrated embodiment, it is desired to effect a three dB coupling between the conductors with a transmission line impedance of 50 ohms. The width of the conductors required to obtain this impedance in the FR-4 dielectric environment is 0.065 inches. The length of the conductors is selected to be a quarter wavelength at the frequency of interest, here 2 gigahertz. The outer dimensions of the illustrated component are 1.365 inches by 0.567 inches by 0.142 inches.

Transmission lines 12 and 14 each terminate at two semicylindrical plated indentations along the edge of component 10. Line 12 terminates at indentations 30 and 32. Line 14 terminates at indentations 34 and 36. In directional coupler parlance, if transmission line 14 is considered to be the primary transmission line, then indentation 34 is the input port, indentation 32 is the coupled output port, indentation 30 is the isolated port and indentation 36 is the direct output port.

In some instances, it may be desired that a transmission line disposed within the strip line component be terminated at ground. In such cases, the ground plane on the upper and lower surfaces of the board can be left intact. The plating in the cut hole will then connect the embedded transmission line to the upper and lower ground planes. If, as is more usually the case, it is desired not to connect the embedded transmission line to ground, the ground planes can be etched away from around the plated holes, as was done around indentation holes 30, 32, 34, 36 in FIGS. 1, 3 and 5, so that the plating connects only to the embedded transmission line and not also to the upper and lower ground planes.

As shown in FIG. 1, it is a simple matter to interface coupler 10 to a conventional circuit board 40. The coupler is simply rested on the circuit board and the connections between the indentations and the board soldered. Since the plating in the indentations extends to both surfaces of the component, the component can be soldered with either surface down. In the embodiment illustrated in FIG. 1, additional indentations 42 are provided for connecting a ground conductor on circuit board 40 to the strip line component ground. Indentations 42 are plated cut indentations that do not intersect transmission lines within the strip line assembly. Thus, they serve merely to connect the upper and lower ground planes together.

Often, microstrip transmission line conductors, such as conductor 44 in FIG. 1, are formed between coplanar ground plane portions 46, 48 to improve the characteristics of the composite transmission line. These coplanar ground portions 46, 48 can be connected directly to the ground planes of the strip line component at plated indentations 42, thereby providing a low loss transition from the microstrip transmission line to the strip line transmission line.

Coupler 10 in FIG. 1 includes two elongated indentations 50, 52 along its sides. These indentations are also plated and serve to connect the upper ground plane to the lower ground plane. Indentations 50 and 52 are well adapted to serve as structural bonding points for soldering the component 10 to circuit board 40.

While component 10 according to the present invention can be fabricated one at a time, it will be appreciated that the associated manufacturing techniques are well adapted to manufacturing dozens of components at a time. Each cut that bisects a hole to expose a plated indentation on the edge of component 10 also exposes a plated indentation on the opposite side of the cut. For example, cut 54 in FIG. 2 which exposed plated indentations 34 and 30 of component 10 also exposed a corresponding pair of plated indentations on the other side of the cut. These other plated indentations could serve as contacts to transmission lines in a coupler component that is identical to component 10 but is mirror-imaged on the other side of line 54.

In the preferred method of manufacture, a large laminar assembly 58 in FIG. 5 is formed that includes a plurality of embedded transmission lines corresponding to a plurality of coupler components, shown in FIG. 6. Corresponding line intersection points 70, 72, 74, 76 show the relationship between FIGS. 5 and 6. With reference to FIG. 5, a first plurality of holes including holes 30, 32, 34, 36 is then formed through this larger laminar assembly 58. Each of these holes is located so as to pass through one of the embedded transmission lines at a point which will ultimately be a contact surface on the edge of the individual component. Desirably, a second plurality of holes 42 is also formed in the larger laminar assembly. These holes are positioned so that they do not pass through the embedded transmission line conductors. Both groups of holes are then plated through with a conducting material. The larger laminar assembly is then cut along grid lines 60 so as to separate the individual components. The exposed plated surfaces on the sides of the individual components can then serve as electrical contact pads to the transmission line conductors disposed within the components and to the components' ground planes.

To form the structural mounting surfaces 50 and 52 shown in FIG. 1, a third plurality of holes can also be formed in the larger assembly. These holes, such as are labeled 50 and 52 in FIG. 5, are routed by a router into an elongated form, such as an oval or rectangle. These holes too are plated through so that, when cut, they expose plated surfaces. As noted, these surfaces can be used as the principal structural bonding points to secure the component to a circuit board by soldering.

FIG. 6 illustrates the embeded transmissin line of the larger laminar assembly 58 with the upper two layers removed. From this figure it will be recognized that each element of a coupler is replicated in symmetrical, mirror image form on each side of the orthogonal cut lines 60 that bound the component. Thus, the L-shaped transmission line 12 of a single component is mirror imaged in this fashion to form a rectangular loop shape, which rectangular loop shape will ultimately be cut to form four L-shaped transmission lines 12 for four coupler components. This symmetrical layout simplifies preparation of the photolithographic transmission line artwork and helps insure that every component is identical to every other component.

As noted earlier, it is generally desirable to etch the upper and lower ground plane portions of each component away from those holes that intersect transmission line conductors so as to prevent these conductors from being connected to the ground planes by the plating. This removal of the upper and lower ground planes can be done on each individual component after it has been cut from the large laminar assembly. More desirably, however, the metallization is etched away from these regions before the laminar assembly is first drilled. The resulting individual components will then already have the illustrated semicircular insulating regions on their upper and lower portions adjacent the plated indentations.

In alternative embodiments, coupler 10 could be formed without plating through holes 30, 32, 34, 36 before they are cut. Instead, these holes could be left unplated until after the larger assembly is cut into individual components. Edge plating could then be applied in a subsequent step to form the desired connection surfaces. However, since a hole plating step is regularly employed to connect the upper and lower ground planes of strip line circuitry together by plated vias, such as vias 64 in FIGS. 1 and 5, the present invention further exploits this step to avoid the necessity of a final edge plating step.

The illustrated coupler costs only about twenty-five cents to manufacture, but provides outstanding performance. The insertion loss is computed to be less than 0.3 dB and has been measured as approximately 0.04 dB. The electrical discontinuity imposed by the strip line-microstrip interface has been modeled and found to be negligible in the 2-4 GHz frequency range. The return loss at 4 GHz is greater than 24 dB. The mismatch loss at this frequency is less than 0.02 dB. The desired coupling is achieved within plus or minus 0.2 dB and the measured directivity is greater than 35 dB.

In summary, coupler 10 of the present invention overcomes the principal drawbacks that have plagued prior art couplers while providing outstanding performance. Coupler 10 can readily be interfaced to a microstrip circuit board by direct soldering, thereby decreasing assembly cost and increasing system reliability. This interface is achieved with negligible loss, thereby optimizing system performance. The coupler component is both thermally and mechanically stable, further improving system reliability. Finally, the component can be manufactured economically and repeatably using conventional multilayer circuit board fabrication techniques, thereby further reducing system cost and optimizing system performance.

Having described and illustrated the principles of our invention in a preferred embodiment, it should be apparent to those skilled in the art that the invention can be modified in arrangement and detail without departing from such principles. For example, the invention can be adapted to the manufacture of a host of circuits other than directional couplers. Similarly, the invention can be used with laminar assemblies having more than one or two embedded layers. Accordingly, we claim as our invention all such modifications as come within the scope and spirit of the following claims and equivalents thereof.

We claim:

1. A method for forming a low loss transition coupling on a strip line circuit component package having a planar conductor disposed between two insulating members in a laminar assembly with the outer surfaces of the insulating members being metallized, the steps comprising:

forming a first hole through the laminar assembly, said first hole being positioned so as to intersect the planar conductor;

forming an insulating region around said first hole by removing a portion of the metallization on the outer surfaces of the insulating members;

forming a second hole through the laminar assembly in close proximity to said first hole, said second hole not intersecting the planar conductor;

plating through said first hole and said second hole with a conducting material so that said conducting material in said first hole is in electrical contact with the planar conductor and said conducting material in said second hole is in contact with the outer metallized surfaces of the insulating members; and cutting the laminar assembly along a line that bisects said first and second holes, exposing said conducting material within said holes to form a low loss transition coupling on the strip line circuit component package.

2. A method of manufacturing strip line component packages, the steps comprising:

forming a laminar assembly having a first symmetrical transmission line conductor interposed between two insulating layers, the outer surface of each said insulating layer being metallized and said first symmetrical transmission line conductor having at least two co-planar axes of symmetry;

forming insulating regions by removing a portion of said metallization on said outer surfaces of said insulating layers at locations where said symmetrical transmission line conductor intersects said axes of symmetry of said symmetrical transmission line conductor;

forming a first plurality of holes through said laminar assembly, each of said first plurality of holes being positioned within said insulating regions and passing through said first symmetrical transmission line conductor;

forming a second plurality of holes through said laminar assembly positioned on said axes of symmetry of said first transmission line conductor, said second plurality of holes in close proximity to said first plurality of holes;

plating through said first and second plurality of holes with a conductive material, said conductive material in said first plurality of holes being in electrical contact with said symmetrical transmission line conductor and insulated from said metallization on said outer surfaces of said insulating layers and said second plurality of holes being in contact with said metallization on said outer surfaces of said insulating layers to provide an electrical contact path between said metallizations; and cutting said laminar assembly along said axes of symmetry of said first symmetrical transmission line conductor to form duplicate strip line circuit component packages, each package having electrical contact pads formed by bisecting said first and second plurality of holes, said first plurality of bisected holes forming electrical contact pads with said first symmetrical transmission line conductor and said second plurality of bisected holes forming ground pads in close proximity to said electrical contact pads, said electrical contact pads and said ground pads forming low loss transition couplings at each of said locations where said symmetrical transmission line conductor intersects said axes of symmetry of said symmetrical transmission line conductor.

3. The method of claim 2 which further comprises the steps of:

forming an elongated hole through said laminar assembly positioned on one of said axes of symmetry of said first symmetrical transmission line conductor; and plating through said elongated hole with a conductive material to provide electrical contact between said metallization on said surfaces of said insulating layers producing a metallized surface for use as a structural bonding point upon bisecting said elongated hole in said cutting step.

4. The method of Claim 2 further comprising the steps of:

forming a second symmetrical transmission line conductor having at least one axis of symmetry the same as one of said axes of symmetry as said first symmetrical transmission line conductor; and interposing an insulating layer between said first symmetrical transmission line conductor and said second symmetrical transmission line conductor.

5. A laminar assembly comprising:

a first symmetrical transmission line conductor having at least two co-planar axes of symmetry and being interposed between two insulating layers, the outer surface of each said insulating layer being metallized;

means for interconnecting said metallized surfaces on said insulating layers, said interconnecting means positioned in close proximity to said first transmission line conductor and on one of said axes of symmetry of said first transmission line conductor; and said laminar assembly having a metallized through hole positioned on one of said axes of symmetry of said first transmission line conductor and intersecting with and passing through said first transmission line conductor such that said metallization in said through hole is in electrical contact with said transmission line conductor, said metallized through hole being insulated from said metallized surfaces on said insulating layers so that cutting said laminar assembly along said axes of symmetry of said first transmission line conductor produces duplicate strip line circuit component packages, each said package having a first electrical contact pad formed by bisecting said metallized through hole and a grounding pad formed by bisecting said interconnecting means, said grounding pad in close proximity to said electrical contact pad forming a low loss transition coupling for said strip line circuit component package.

6. The laminar assembly of claim 5 wherein said interconnecting means is a metallized through hole.

7. The laminar assembly of claim 5 further comprising metallized through holes positioned at each intersection of said first symmetrical transmission line conductor and said axes of symmetry and corresponding interconnecting means positioned on said axes of symmetry of said first symmetrical transmission line conductor and in close proximity to said metallized through holes forming low loss transition couplings on said strip line circuit component packages during cutting of said laminar assembly along said axes of symmetry of said first symmetrical transmission line conductor, each low loss transition coupling formed by the bisection of one of said metallized through holes and said corresponding interconnecting means during cutting.

8. The laminar assembly of Claim 5 further comprising an elongated metallized through hole positioned on and bisected by one of said axes of symmetry of said first symmetrical transmission line conductor producing a metallized surface for use as a structural bonding point during cutting of said laminar assembly along said axes of symmetry of said first symmetrical transmission line conductor.

9. The laminar assembly of Claim 5 further comprising:

a second symmetrical transmission line conductor having at least one axis of symmetry the same as one of said axes of symmetry of said first symmetrical transmission line conductor; and an insulating layer interposed between said first symmetrical transmission line conductor and said second symmetrical transmission line conductor.

* * * * *